United States Patent
Jiang et al.

(10) Patent No.: US 10,453,874 B2
(45) Date of Patent: Oct. 22, 2019

(54) MANUFACTURING METHOD FOR ARRAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Chunsheng Jiang, Shenzhen (CN); Yue Wu, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 119 days.

(21) Appl. No.: 15/578,979

(22) PCT Filed: Nov. 28, 2017

(86) PCT No.: PCT/CN2017/113328
§ 371 (c)(1),
(2) Date: Dec. 1, 2017

(87) PCT Pub. No.: WO2018/176880
PCT Pub. Date: Oct. 4, 2018

(65) Prior Publication Data
US 2018/0301478 A1    Oct. 18, 2018

(30) Foreign Application Priority Data
Mar. 30, 2017    (CN) .......................... 2017 1 0202255

(51) Int. Cl.
*H01L 27/12* (2006.01)
*H01L 29/66* (2006.01)
(Continued)

(52) U.S. Cl.
CPC .... *H01L 27/1259* (2013.01); *H01L 21/31133* (2013.01); *H01L 21/32138* (2013.01);
(Continued)

(58) Field of Classification Search
CPC ......... H01L 21/02054; H01L 21/31111; H01L 21/31133; H01L 21/32138; H01L 27/1259
See application file for complete search history.

(56) References Cited

U.S. PATENT DOCUMENTS 5,897,716 A * 4/1999 Reghi .................... B05D 3/102
148/247
6,599,370 B2 * 7/2003 Skee .................... C11D 3/0073
134/10
(Continued)

FOREIGN PATENT DOCUMENTS

| CN | 1875325 A | 12/2006 |
|---|---|---|
| CN | 104952932 A | 9/2015 |
| JP | 2004212818 A | 7/2004 |

*Primary Examiner* — Zandra V Smith
*Assistant Examiner* — John M Parker
(74) *Attorney, Agent, or Firm* — Hauptman Ham, LLP (57) ABSTRACT

A manufacturing method for an array substrate is provided. The manufacturing method includes steps of: forming a first metal layer, a gate electrode layer, a gate electrode insulated layer, a semiconductor layer, a second metal layer, a source electrode layer, and a drain electrode layer on a base substrate in order. The step of forming the gate electrode layer on the first metal layer further includes steps of: depositing a gate electrode metal layer; exposing, developing, and wet etching on the gate electrode metal layer; and removing a photoresist layer. Metal cations are added into a stripper liquid, an electrochemical corrosion potential of which is less than that of the first metal layer, so as to avoid a short line problem.

18 Claims, 4 Drawing Sheets

(51) Int. Cl.
  *H01L 29/423* (2006.01)
  *H01L 21/3213* (2006.01)
  *H01L 29/786* (2006.01)
  *H01L 29/49* (2006.01)
  *H01L 21/311* (2006.01)

(52) U.S. Cl.
  CPC ...... *H01L 21/32139* (2013.01); *H01L 27/124* (2013.01); *H01L 27/1255* (2013.01); *H01L 29/42384* (2013.01); *H01L 29/4908* (2013.01); *H01L 29/66742* (2013.01); *H01L 29/78696* (2013.01)

(56) References Cited

U.S. PATENT DOCUMENTS

| | | | |
|---|---|---|---|
| 9,893,206 B2 * | 2/2018 | Wang | H01L 29/78696 |
| 2007/0060490 A1 | 3/2007 | Skee | |
| 2017/0335252 A1 * | 11/2017 | Mizutani | C11D 3/0073 |

* cited by examiner

Prior Art

Fig. 5

MANUFACTURING METHOD FOR ARRAY SUBSTRATE

FIELD OF THE INVENTION

The present disclosure relates to a field of liquid crystal displays, and more particularly to a manufacturing method for an array substrate.

BACKGROUND OF THE INVENTION

Liquid crystal display devices (LCDs) have many advantages, such as thin body, non-radiation, and power saving, so that they are widely used. Generally, a liquid crystal display pane includes a color filter (CF) substrate, a thin film transistor (TFT) array substrate, and liquid crystal disposed between the CF substrate and the TFT array substrate. The directions of the liquid crystal molecules are changed by providing the power to the TFT array substrate or not, and then lights of a backlight module are projected to the CF substrate to produce images. The property and performance of the TFT array substrate are most dependent upon the materials forming each element of the TFT array substrate. Metal conducting wires are arranged on the TFT array substrate, and the metal conducting wires are made by etching a metal layer on the TFT array substrate by a physical vapor deposition (PVD) method. The etching processes includes a dry etching process and a wet etching process.

A common metal conducting wire used in the TFT array substrate is an aluminum conducting wire. However, with the development of the liquid crystal display (for example a television) trending and requiring a large size, high resolution, and high speed driving frequency, technical personnel in the liquid crystal display field face a problem: a resistance-capacitance (RC) delay time caused by the resistance of the TFT array substrate. Because the aluminum conducting wire has a higher resistance rate, a pixel electrode layer of the TFT array substrate cannot be charged completely; moreover, with HI-FAS (high frequency amplitude selection: greater than 120 Hz) liquid crystal displays being widely used, the above-mentioned phenomenon is more obvious. Compared with the aluminum conducting wire, a copper conducting wire has a lower resistance rate and a better electromigration resistance ability, so as to be used on the TFT array substrate to solve the above-mentioned problem caused by the aluminum conducting wire.

An adhering property between copper and glass is poor, so it is necessary to use an under bump metal layer to be transited. Furthermore, when above 200° C., copper easily reacts with silicon to produce a chemical compound including copper-silicon (CuSi3) by an inter-diffusion effect. That is, copper will react with a semiconductor layer of the TFT array substrate to produce a very high contacting resistance, so that it is also necessary to use another under bump metal layer to be transited. Nowadays, a common method is to use a refractory metal to be a transitional adhesive layer or barrier layer, such as molybdenum (Mo), titanium (Ti), alloy with corresponding elements, etc. However, after an etching process, different metals or alloys of barrier layers form different profiles. For example, when stripping a photoresist, a contacting edge between a copper and a molybdenum produces a hollow phenomenon, forming a crack. This hollow phenomenon will cause a short circuit in a source electrode, a drain electrode, or a gate electrode, so that the yield of the display terminal is influenced, obviously.

Figure 4:
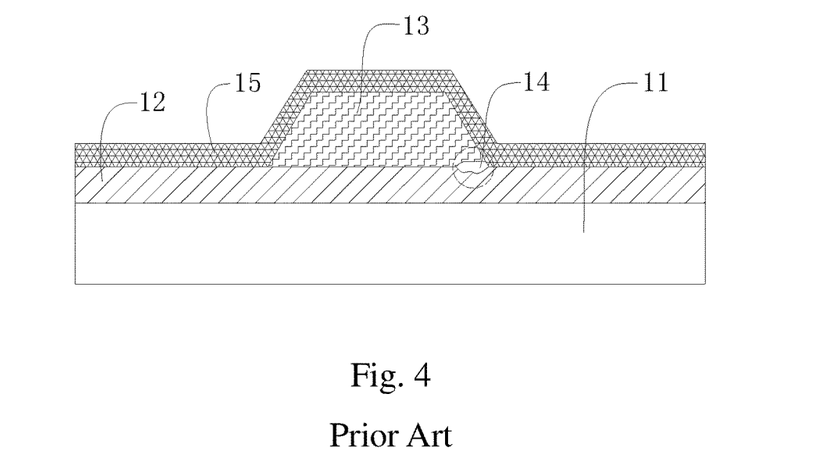
FIG. 4 is a schematic cross-sectional view showing the whole of a structure that a gate electrode layer and a first metal layer are covered with a gate electrode insulation layer in a conventional manufacturing method for an array substrate.

Refer now to FIG. 4, which is a schematic cross-sectional view showing in a conventional manufacturing method for an array substrate, the whole of a structure of a gate electrode layer 13 and a first metal layer 12 are covered with a gate electrode insulation layer 15. As shown in FIG. 4, in the conventional technology, there is a crack 14 on a contacting edge between the gate electrode layer 13 and the first metal layer 12 on a base substrate 11.

SUMMARY OF THE INVENTION

The object of the present disclosure is to provide a manufacturing method for an array substrate to solve a technical problem: in a conventional technologies, when a stripper liquid is used to strip a photoresist, a contacting edge between the gate electrode layer and the first metal layer produces a hollow phenomenon, forming a crack, and it further causes a short line problem on the gate electrode layer, the source electrode layer, and the drain electrode layer.

The present disclosure provides technical solutions as follows:

A manufacturing method for an array substrate, which comprises steps of:
  forming a first metal layer, a gate electrode layer, a gate electrode insulated layer, a semiconductor layer, and a second metal layer on a base substrate in order; and
  forming a source electrode layer and a drain electrode layer on the second metal layer;
  wherein the step of forming the gate electrode layer on the first metal layer further includes steps of:
  depositing a gate electrode metal layer of the gate electrode layer on the first metal layer;
  coating a photoresist layer on the gate electrode metal layer; exposing and developing the gate electrode metal layer; and processing a wet etching on the gate electrode metal layer until the first metal layer is exposed; and using a first stripper liquid to remove the photoresist layer on the gate electrode metal layer, so as to form the gate electrode layer;
  wherein first metal cations are added into the first stripper liquid, and an electrochemical corrosion potential of the first metal cations is less than or equal to that of the first metal layer.

Preferably, the step of forming the source electrode layer and the drain electrode on the second metal layer further includes steps of:
  depositing a source-drain electrode metal layer of the source electrode layer and a drain electrode on the second metal layer;
  coating a photoresist layer on the source-drain electrode metal layer; exposing and developing the source-drain electrode metal layer; and processing a wet etching to the source-drain electrode metal layer until the second metal layer is exposed; and
  using a second stripper liquid to remove the photoresist layer on the source-drain electrode metal layer, so as to form the source electrode layer and the drain electrode;
  wherein second metal cations are added into the second stripper liquid, and an electrochemical corrosion potential of the second metal cations is less than or equal to that of the second metal layer.

Preferably, after the source electrode layer and the drain electrode are formed, the manufacturing method further includes steps of:
  forming a flat layer on the source electrode layer and the drain electrode;

forming a via on the flat layer which is on the drain electrode, wherein the via is connected with the drain electrode; and forming a pixel electrode layer on the flat layer, wherein the pixel electrode layer is connected with the drain electrode through the via.

Preferably, an electrochemical corrosion potential of the gate electrode layer is higher than that of the first metal layer; and an electrochemical corrosion potential of the source electrode layer and the drain electrode layer is higher than that of the second metal layer.

Preferably, a thickness of the first metal layer is less than that of the gate electrode layer; and a thickness of the second metal layer is less than that of the source electrode layer and the drain electrode layer.

Preferably, a thickness of the gate electrode insulated layer is less than that of the gate electrode layer; and the thickness of the gate electrode insulated layer is one third of the thickness of the gate electrode layer.

Preferably, manufacturing materials of the first metal layer and the second metal layer are both molybdenum metal materials or are both metal materials which have an electrochemical corrosion potential less than that of the molybdenum metal material.

Preferably, the first stripper liquid and the second stripper liquid are provided by a stripper equipment; the stripper equipment has a metal grid, an electrochemical corrosion potential of which is less than or equal to that of the first metal layer and less than or equal to that of the second metal layer; and the metal grid is configured to allow the first metal cations or the second metal cations to pass therethrough.

Preferably, the first metal cations and the second metal cations are both molybdenum metal cations.

Preferably, manufacturing materials of the gate electrode layer, the source electrode layer, and the drain electrode layer are made of copper material.

A manufacturing method for an array substrate, which comprises steps of:

forming a first metal layer, a gate electrode layer, a gate electrode insulated layer, a semiconductor layer, and a second metal layer on a base substrate in order; and forming a source electrode layer and a drain electrode layer on the second metal layer;

wherein the step of forming the gate electrode layer on the first metal layer further includes steps of:

depositing a gate electrode metal layer of the gate electrode layer on the first metal layer;

coating a photoresist layer on the gate electrode metal layer; exposing and developing the gate electrode metal layer; and processing a wet etching on the gate electrode metal layer until the first metal layer is exposed; and using a first stripper liquid to remove the photoresist layer on the gate electrode metal layer, so as to form the gate electrode layer;

wherein first metal cations are added into the first stripper liquid, and an electrochemical corrosion potential of the first metal cations is less than or equal to that of the first metal layer;

wherein the step of forming the source electrode layer and the drain electrode on the second metal layer further includes steps of:

depositing a source-drain electrode metal layer of the source electrode layer and a drain electrode on the second metal layer;

coating a photoresist layer on the source-drain electrode metal layer; exposing and developing the source-drain electrode metal layer; and processing a wet etching to the source-drain electrode metal layer until the second metal layer is exposed; and using a second stripper liquid to remove the photoresist layer on the source-drain electrode metal layer, so as to form the source electrode layer and the drain electrode;

wherein second metal cations are added into the second stripper liquid, and an electrochemical corrosion potential of the second metal cations is less than or equal to that of the second metal layer;

wherein after the source electrode layer and the drain electrode are formed, the manufacturing method further includes steps of:

forming a flat layer on the source electrode layer and the drain electrode;

forming a via on the flat layer which is on the drain electrode, wherein the via is connected with the drain electrode; and forming a pixel electrode layer on the flat layer, wherein the pixel electrode layer is connected with the drain electrode through the via.

Preferably, an electrochemical corrosion potential of the gate electrode layer is higher than that of the first metal layer; and an electrochemical corrosion potential of the source electrode layer and the drain electrode layer is higher than that of the second metal layer.

Preferably, a thickness of the first metal layer is less than that of the gate electrode layer; and a thickness of the second metal layer is less than that of the source electrode layer and the drain electrode layer.

Preferably, a thickness of the gate electrode insulated layer is less than that of the gate electrode layer; and the thickness of the gate electrode insulated layer is one third of the thickness of the gate electrode layer.

Preferably, manufacturing materials of the first metal layer and the second metal layer are both made of molybdenum materials or are both metal materials which have an electrochemical corrosion potential less than that of the molybdenum metal material.

Preferably, the first stripper liquid and the second stripper liquid are provided by a stripper equipment; the stripper equipment has a metal grid, an electrochemical corrosion potential of which is less than or equal to that of the first metal layer and less than or equal to that of the second metal layer; and the metal grid is configured to allow the first metal cations or the second metal cations to pass therethrough.

Preferably, the first metal cations and the second metal cations are both molybdenum metal cations.

Preferably, manufacturing materials of the gate electrode layer, the source electrode layer, and the drain electrode layer are made of copper material.

The advantages of the present disclosure are that the present disclosure is to provide a manufacturing method for an array substrate to solve a technical problem: when a stripper liquid is used to strip a photoresist, a contacting edge between the gate electrode layer and the first metal layer produces a hollow phenomenon, forming a crack, causing a short line problem on the gate electrode layer, the source electrode layer, and the drain electrode layer.

DETAILED DESCRIPTION OF THE PREFERRED EMBODIMENTS

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions present invention is not limited thereto. In the drawings, units with similar structures use the same numerals.

Embodiment One

Figure 1:
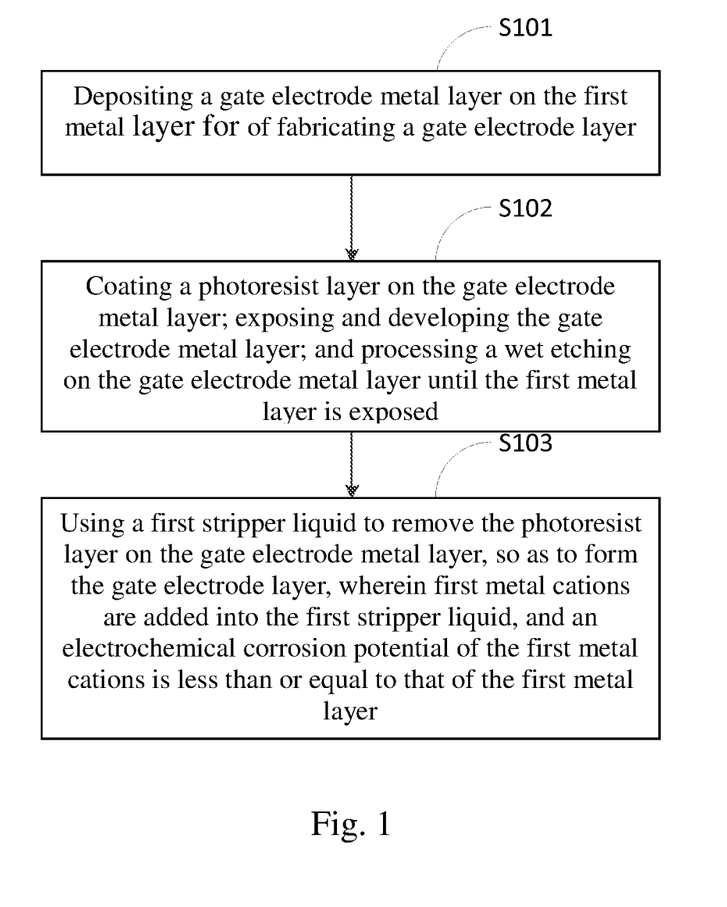
FIG. 1 is a flowchart showing an executing step of that a gate electrode layer is formed on a first metal layer according to an embodiment of the present disclosure.
Figure 2:
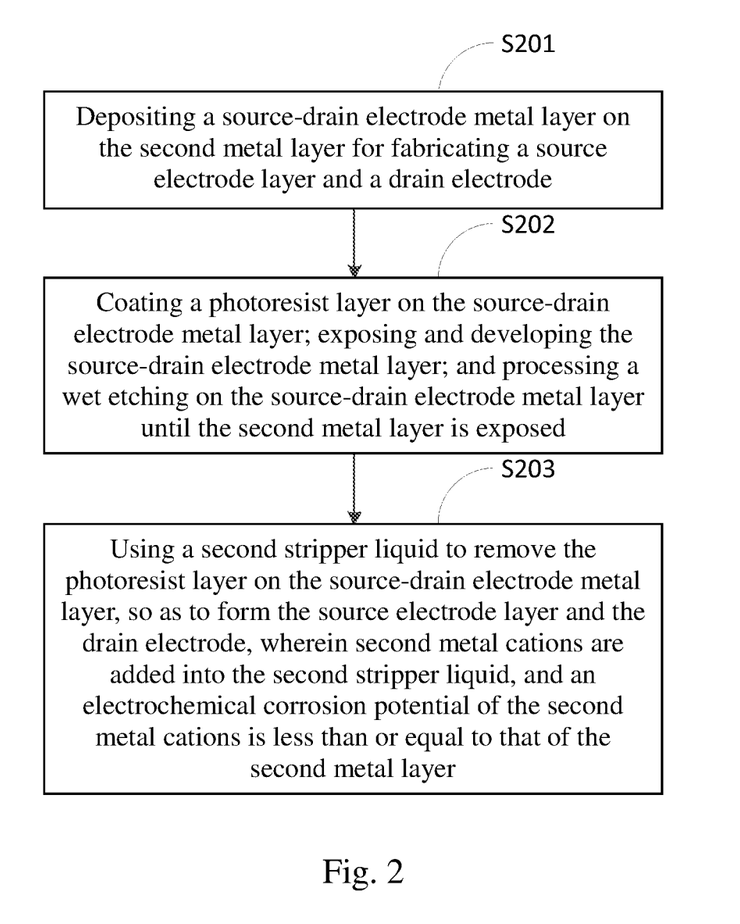
FIG. 2 is a flowchart showing an executing step of that a source electrode layer and a drain electrode layer are formed on a second metal layer according to the embodiment of the present disclosure.
Figure 3:
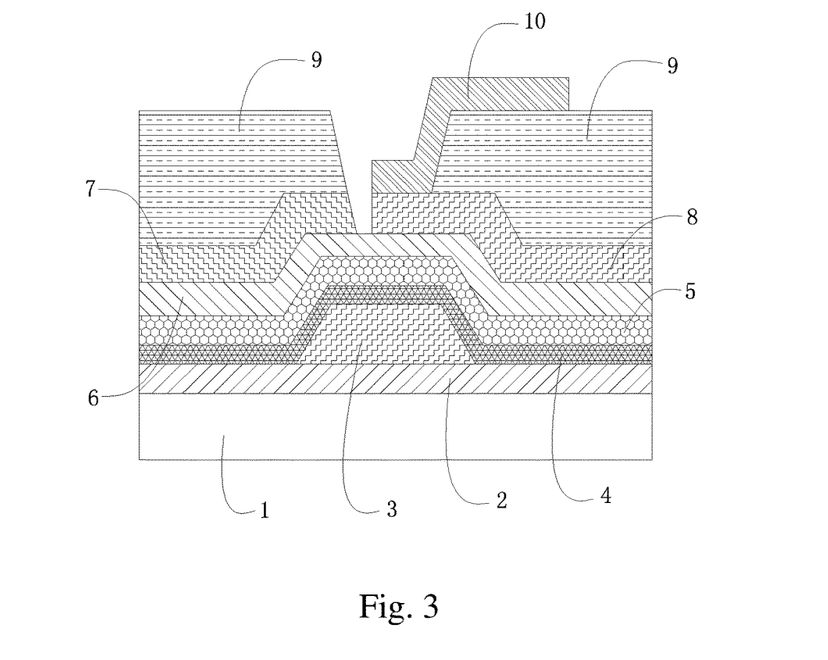
FIG. 3 is a schematic cross-sectional view of whole of a structure of an array substrate according to the embodiment of the present disclosure.

Refer now to FIGS. 1 to 3. FIG. 1 is a flowchart showing an executing step of a gate electrode layer being formed on a first metal layer according to an embodiment of the present disclosure.

FIG. 2 is a flowchart showing an executing step of a source electrode layer and a drain electrode layer are formed on a second metal layer according to the embodiment of the present disclosure.

FIG. 3 is a schematic cross-sectional view of the whole of a structure of an array substrate according to the embodiment of the present disclosure.

A manufacturing method for an array substrate according to an embodiment of the present disclosure includes the following steps of:

Firstly, forming a first metal layer 2 on a base substrate 1, wherein the base substrate 1 is preferably a glass substrate.

Secondly, forming a gate electrode layer 3 on the first metal layer 2.

Thirdly, forming a gate electrode insulated layer 4 on the gate electrode layer 3.

Fourthly, forming a semiconductor layer 5 on the gate electrode insulated layer 4.

Fifthly, forming a second metal layer 6 on the semiconductor layer 5.

Sixthly, forming a source electrode layer 7 and a drain electrode layer 8 on the second metal layer 6.

In the embodiment, as shown in FIG. 1, the step of forming the gate electrode layer 3 on the first metal layer 2 further includes the following steps of:

Step S101: depositing a gate electrode metal layer on the first metal layer 2 for fabricating a gate electrode layer 3.

Step S102: coating a photoresist layer on the gate electrode metal layer; exposing and developing the gate electrode metal layer; and processing a wet etching on the gate electrode metal layer until the first metal layer 2 is exposed.

Step S103: using a first stripper liquid to remove the photoresist layer on the gate electrode metal layer, so as to form the gate electrode layer 3, wherein first metal cations are added into the first stripper liquid, and an electrochemical corrosion potential of the first metal cations is less than or equal to that of the first metal layer 2. That is, the first stripper liquid includes the cations, and the cations are a chelating agent.

In the embodiment, as shown in FIG. 2, the step of forming the source electrode layer 7 and the drain electrode 8 on the second metal layer 6 further includes the following steps of:

Step S201: depositing a source-drain electrode metal layer on the second metal layer 6 for fabricating the source electrode layer 7 and a drain electrode 8.

Step S202: coating a photoresist layer on the source-drain electrode metal layer; exposing and developing the source-drain electrode metal layer; and processing a wet etching on the source-drain electrode metal layer until the second metal layer 6 is exposed.

Step S203: using a second stripper liquid to remove the photoresist layer on the source-drain electrode metal layer, so as to form the source electrode layer 7 and the drain electrode 8, wherein the second stripper liquid includes cations, and the cations are a chelating agent. That is, the second metal cations are added into the second stripper liquid, and an electrochemical corrosion potential of the second metal cations is less than or equal to that of the second metal layer 6.

In the embodiment, after the source electrode layer 7 and the drain electrode 8 are formed, the manufacturing method further includes the following steps of:

Forming a flat layer 9 on the source electrode layer 7 and the drain electrode 8;

Forming a via on the flat layer 9 which is on the drain electrode 8, wherein the via is connected with the drain electrode 8;

Forming a pixel electrode layer 10 on the flat layer 9, wherein the pixel electrode layer 10 is connected with the drain electrode 8 through the via.

In the embodiment, an electrochemical corrosion potential of the gate electrode layer 3 is higher than that of the first metal layer 2; and an electrochemical corrosion potential of the source electrode layer 7 and the drain electrode layer 8 is higher than that of the second metal layer 6.

In the embodiment, a thickness of the first metal layer 2 is less than that of the gate electrode layer 3; and a thickness of the second metal layer 6 is less than that of the source electrode layer 7 and the drain electrode layer 8.

In the embodiment, a thickness of the gate electrode insulated layer 4 is less than that of the gate electrode layer 3; and the thickness of the gate electrode insulated layer 4 is one third of the thickness of the gate electrode layer 3.

In the embodiment, manufacturing materials of the first metal layer 2 and the second metal layer 6 are both made of molybdenum materials or are both metal materials which have an electrochemical corrosion potential less than that of the molybdenum metal material.

In the embodiment, the first stripper liquid and the second stripper liquid are provided by a stripper equipment, and the stripper equipment has a metal grid, an electrochemical corrosion potential of which is less than or equal to that of the first metal layer 2 and less than or equal to that of the second metal layer 6. The metal grid is used for allowing the first metal cations or the second metal cations to pass therethrough. The metal grid of the present disclosure ensures that a reactive metal is continuously added into the first stripper liquid and the second stripper liquid, so as to effectively restrain the electrochemical corrosion of the above-mentioned gate electrode metal layer and the source-drain electrode metal layer.

In the embodiment, the first metal cations and the second metal cations are both molybdenum metal cations.

In the embodiment, manufacturing materials of the gate electrode layer 3, the source electrode layer 7, and the drain electrode layer 8 are copper metal material.

Figure 5:
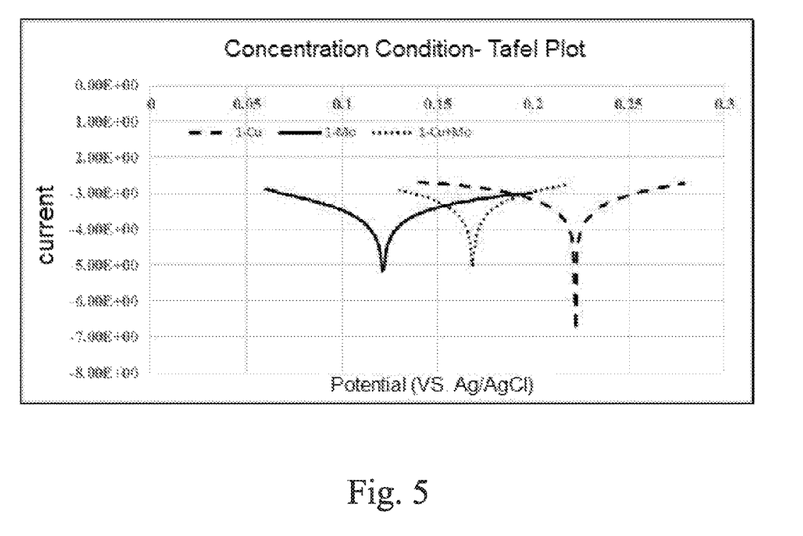
FIG. 5 is a curved chart showing that a result of a corrosion test of a copper metal, a molybdenum metal, and a copper-molybdenum alloy in a certain range of concentration condition.

A principle of the present disclosure is described as follows:

FIG. 5 is a curved chart showing that a result of a corrosion test of a copper metal, a molybdenum metal, and a copper-molybdenum alloy in a certain range of concentration condition, namely a Tafel Plot.

In the chart, the horizontal axis is the potential which is added on the corroded metal, wherein if the added potential is increased, the corrosion is heightened; and if the added potential is decreased, the corrosion is lowered. The vertical axis is a log value of a current under a certain potential. The copper metal and the molybdenum metal have different corrosion potentials when being melted (because the copper metal and the molybdenum metal have different activity degrees), so that when they are contacted with a conduct solution (such as an etching liquid and a wash water after etching), a galvanic couple corrosion is begun. As shown in the above-mentioned chart, in the conduct solution, the metal having a lower electrochemical corrosion potential is easily corroded and firstly corroded.

According to the above-mentioned principle, when the first stripper liquid is used to strip the photoresist layer on the gate electrode metal layer, the first metal cations can effectively restrain the first metal layer 2 against the chemical corrosion, so as to avoid a problem that a crack is produced causing a short line in the array substrate. In the same way, when the second stripper liquid is used to strip the photoresist layer on the source-drain electrode metal layer, the second metal cations can effectively restrain the second metal layer 6 against the chemical corrosion, so as to avoid a problem that a crack is produced causing a short line in the array substrate.

The present disclosure provides a manufacturing method for an array substrate which solves a problem: in the conventional technologies, when a stripper liquid is used to strip a photoresist, a contacting edge between the gate electrode layer 3 and the first metal layer 2 produces a hollow phenomenon, forming a crack, and it further causes a short line problem on the gate electrode layer 3, the source electrode layer 7, and the drain electrode layer 8.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A manufacturing method for an array substrate, comprising steps of:
    forming a first metal layer, a gate electrode layer, a gate electrode insulated layer, a semiconductor layer, and a second metal layer on a base substrate in order; and
    forming a source electrode layer and a drain electrode layer on the second metal layer;
    wherein the step of forming the gate electrode layer on the first metal layer further includes steps of:
        depositing a gate electrode metal layer on the first metal layer for fabricating a gate electrode layer;
        coating a photoresist layer on the gate electrode metal layer;
        exposing and developing the gate electrode metal layer; and
        processing a wet etching on the gate electrode metal layer until the first metal layer is exposed; and
        using a first stripper liquid to remove the photoresist layer on the gate electrode metal layer, so as to form the gate electrode layer;
    wherein first metal cations are added into the first stripper liquid, and an electrochemical corrosion potential of the first metal cations is less than or equal to that of the first metal layer.

2. The manufacturing method according to claim 1, wherein the step of forming the source electrode layer and the drain electrode on the second metal layer further includes steps of:
    depositing a source-drain electrode metal layer on the second metal layer for fabricating a source electrode layer and a drain electrode;
    coating a photoresist layer on the source-drain electrode metal layer;
    exposing and developing the source-drain electrode metal layer; and
    processing a wet etching on the source-drain electrode metal layer until the second metal layer is exposed; and
    using a second stripper liquid to remove the photoresist layer on the source-drain electrode metal layer, so as to form the source electrode layer and the drain electrode;
    wherein second metal cations are added into the second stripper liquid, and an electrochemical corrosion potential of the second metal cations is less than or equal to that of the second metal layer.

3. The manufacturing method according to claim 2, wherein the first stripper liquid and the second stripper liquid are provided by a stripper equipment; the stripper equipment has a metal grid, an electrochemical corrosion potential of which is less than or equal to that of the first metal layer and less than or equal to that of the second metal layer; and the metal grid is configured to allow the first metal cations or the second metal cations to pass therethrough.

4. The manufacturing method according to claim 2, wherein the first metal cations and the second metal cations are both molybdenum cations.

5. The manufacturing method according to claim 1, wherein after the source electrode layer and the drain electrode are formed, the manufacturing method further includes steps of:
    forming a flat layer on the source electrode layer and the drain electrode;
    forming a via on the flat layer which is on the drain electrode, wherein the via is connected with the drain electrode; and
    forming a pixel electrode layer on the flat layer, wherein the pixel electrode layer is connected with the drain electrode through the via.

6. The manufacturing method according to claim 1, wherein an electrochemical corrosion potential of the gate electrode layer is higher than that of the first metal layer; and an electrochemical corrosion potential of the source electrode layer and the drain electrode layer is higher than that of the second metal layer.

7. The manufacturing method according to claim 1, wherein a thickness of the first metal layer is less than that of the gate electrode layer; and a thickness of the second metal layer is less than that of the source electrode layer and the drain electrode layer.

8. The manufacturing method according to claim 1, wherein a thickness of the gate electrode insulated layer is less than that of the gate electrode layer; and the thickness of the gate electrode insulated layer is one third of the thickness of the gate electrode layer.

9. The manufacturing method according to claim 1, wherein the first metal layer and the second metal layer are both made of molybdenum materials or are both metal materials which have an electrochemical corrosion potential less than that of the molybdenum metal material.

10. The manufacturing method according to claim 1, wherein the gate electrode layer, the source electrode layer and the drain electrode layer are made of copper material.

11. A manufacturing method for an array substrate, comprising steps of:
   forming a first metal layer, a gate electrode layer, a gate electrode insulated layer, a semiconductor layer, and a second metal layer on a base substrate in order; and forming a source electrode layer and a drain electrode layer on the second metal layer;
   wherein the step of forming the gate electrode layer on the first metal layer further includes steps of:
      depositing a gate electrode metal layer on the first metal layer for fabricating a gate electrode layer;
      coating a photoresist layer on the gate electrode metal layer;
      exposing and developing the gate electrode metal layer; and
      processing a wet etching on the gate electrode metal layer until the first metal layer is exposed; and
      using a first stripper liquid to remove the photoresist layer on the gate electrode metal layer, so as to form the gate electrode layer;
      wherein first metal cations are added into the first stripper liquid, and an electrochemical corrosion potential of the first metal cations is less than or equal to that of the first metal layer;
   wherein the step of forming the source electrode layer and the drain electrode on the second metal layer further includes steps of:
      depositing a source-drain electrode metal layer on the second metal layer for fabricating a source electrode layer and a drain electrode;
      coating a photoresist layer on the source-drain electrode metal layer;
      exposing and developing the source-drain electrode metal layer; and
      processing a wet etching on the source-drain electrode metal layer until the second metal layer is exposed; and
      using a second stripper liquid to remove the photoresist layer on the source-drain electrode metal layer, so as to form the source electrode layer and the drain electrode;
      wherein second metal cations are added into the second stripper liquid, and an electrochemical corrosion potential of the second metal cations is less than or equal to that of the second metal layer;
   wherein after the source electrode layer and the drain electrode are formed, the manufacturing method further includes steps of:
      forming a flat layer on the source electrode layer and the drain electrode;
      forming a via on the flat layer which is on the drain electrode, wherein the via is connected with the drain electrode; and
      forming a pixel electrode layer on the flat layer, wherein the pixel electrode layer is connected with the drain electrode through the via.

12. The manufacturing method according to claim 11, wherein an electrochemical corrosion potential of the gate electrode layer is higher than that of the first metal layer; and an electrochemical corrosion potential of the source electrode layer and the drain electrode layer is higher than that of the second metal layer.

13. The manufacturing method according to claim 11, wherein a thickness of the first metal layer is less than that of the gate electrode layer; and a thickness of the second metal layer is less than that of the source electrode layer and the drain electrode layer.

14. The manufacturing method according to claim 11, wherein a thickness of the gate electrode insulated layer is less than that of the gate electrode layer; and the thickness of the gate electrode insulated layer is one third of the thickness of the gate electrode layer.

15. The manufacturing method according to claim 11, wherein the first metal layer and the second metal layer are both made of molybdenum materials or are both metal materials which have an electrochemical corrosion potential less than that of the molybdenum metal material.

16. The manufacturing method according to claim 11, wherein the first stripper liquid and the second stripper liquid are provided by a stripper equipment; the stripper equipment has a metal grid, an electrochemical corrosion potential of which is less than or equal to that of the first metal layer and less than or equal to that of the second metal layer; and the metal grid is configured to allow the first metal cations or the second metal cations to pass therethrough.

17. The manufacturing method according to claim 11, wherein the first metal cations and the second metal cations are both molybdenum metal cations.

18. The manufacturing method according to claim 11, wherein the gate electrode layer, the source electrode layer and the drain electrode layer are made of copper material.

* * * * *